United States Patent [19]

Laroche et al.

[11] 4,424,481

[45] Jan. 3, 1984

[54] APPARATUS FOR MEASURING AN ELECTRICAL FIELD

[75] Inventors: Pierre A. R. M. Laroche, Corbeil; Roland J. Hoarau, l'Hay les Roses; Patrice G. M. Brault, Lorient, all of France

[73] Assignee: Office National d'Etudes et de Recherchés Aerospatiales (O.N.E.R.A.), Chatillon, France

[21] Appl. No.: 236,618

[22] Filed: Feb. 20, 1981

[30] Foreign Application Priority Data

Feb. 22, 1980 [FR] France ................................ 80 04017

[51] Int. Cl.³ ............................................. G01R 31/02
[52] U.S. Cl. ...................................... 324/72; 324/457; 324/458
[58] Field of Search .......................... 324/72, 457, 458; 328/28, 127, 158

[56] References Cited

U.S. PATENT DOCUMENTS 3,611,365 10/1971 Lundquist et al. ................... 324/72

FOREIGN PATENT DOCUMENTS 580525 11/1977 U.S.S.R. ............................... 324/457

OTHER PUBLICATIONS

*Pure and Applied Geophysics,* vol. 62, 1965, pp. 191–197, The Measurement of Electric Fields in Clouds", Walter H. Evans.
Jernel, Fakulti Kejuruteraan, vol. 16, Jun. 1977, pp. 12–19, "An Improved Electrostatic Field Meter of the Smith Type", C. M. Wong & K. K. Lim.

Primary Examiner—Michael J. Tokar
Assistant Examiner—Kevin D. O'Shea
Attorney, Agent, or Firm—Staas & Halsey

[57] ABSTRACT

A sensing element for measuring atmospheric electrical field comprising a fixed detection electrode and a rotating modulator. Between the detection electrode and the rotating modulator there is interposed a fixed apertured screen, conductive of electricity and connected to the sensing element mass. The screen has a peripheral portion protruding relative to the modulator. The sensing element measures both slow field variations and abrupt field variations.

12 Claims, 16 Drawing Figures

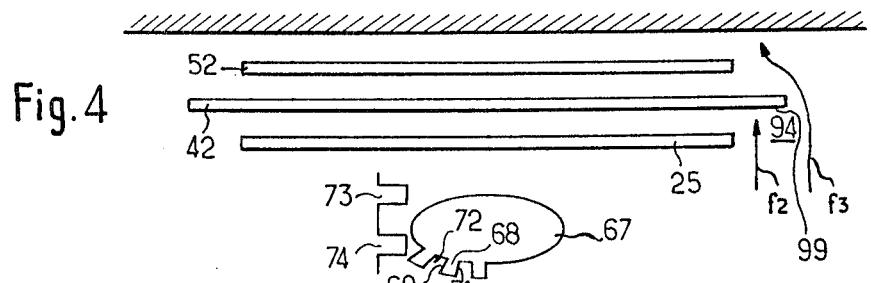
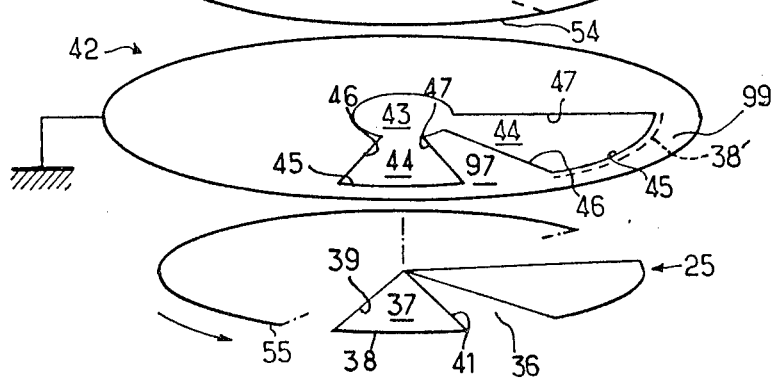
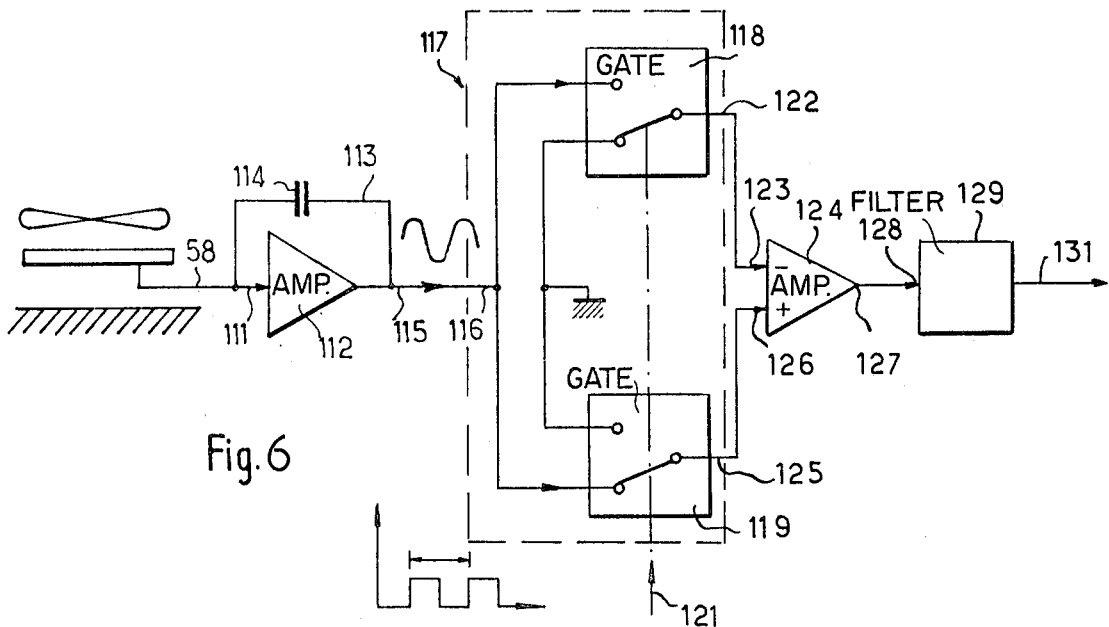

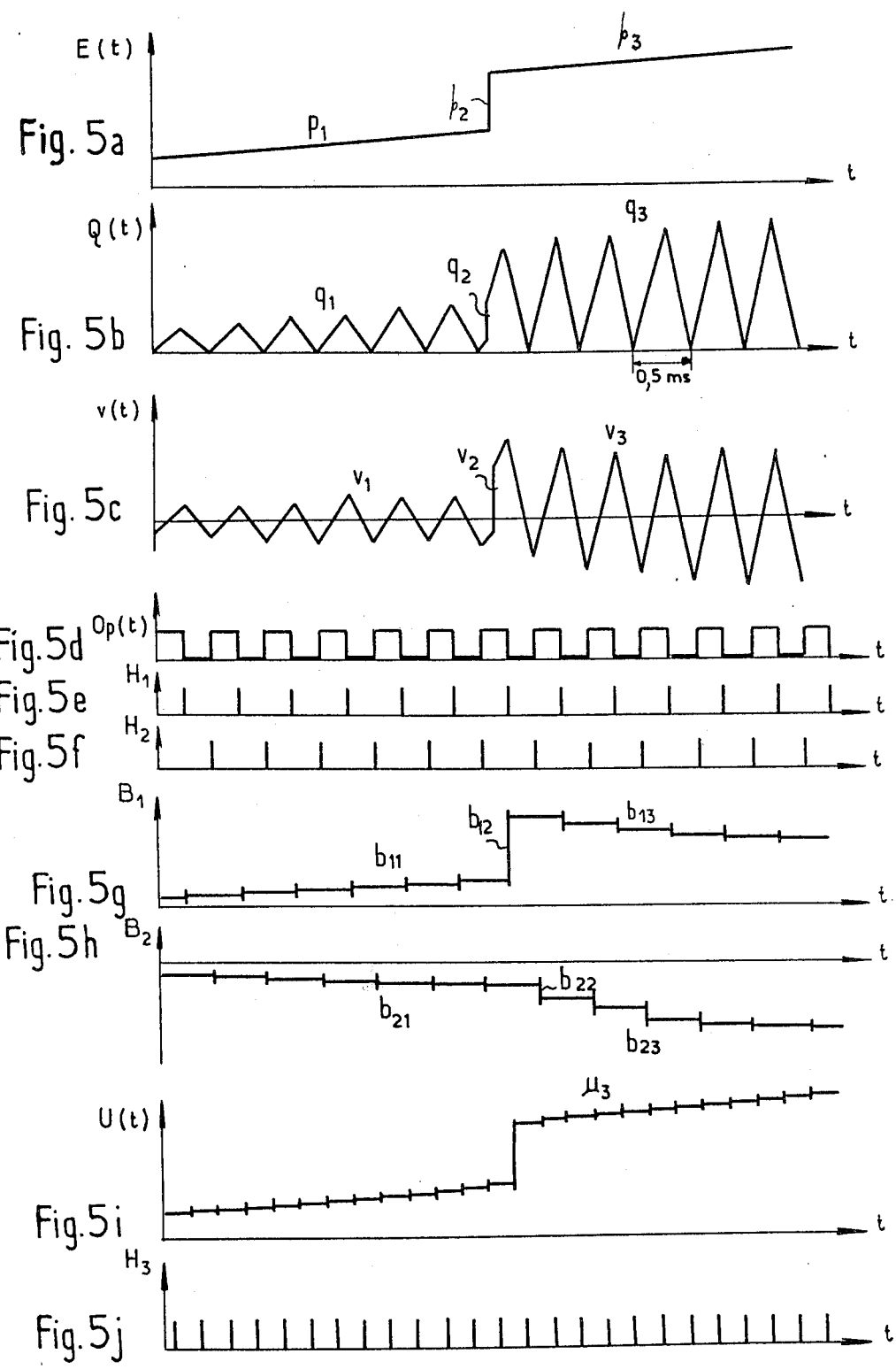

APPARATUS FOR MEASURING AN ELECTRICAL FIELD

FIELD OF THE INVENTION

The present invention is directed to an apparatus for measuring an electrical field, particularly the atmospheric electrical field.

The atmospheric electrical field in a given place is generally subjected to slow variations, as a function of the displacement of cloud masses, and to very rapid variations caused by electrical discharges during storms (e.g., lightnings).

BACKGROUND OF THE INVENTION

For measuring the atmospheric electrical field, it has already been proposed to use an electrometer made of a metallic electrode disposed in the field and the potential of which, relative to the ground, is measured by means of an amplifying DC device having a high input impedance. Such an apparatus can provide information only where field variations result from electrical discharges, and is not sensitive to the continuous component of the field. Moreover, an accidental variation of its input impedance due to the environment changes the apparatus sensitivity.

An apparatus has also been used comprising an ionizing probe sensing element for detecting the current caused by the field in the space charge created by an α radiation probe. But such a sensing element is particularly sensitive on the one hand to humidity which puts an end to the ionizing emission, and on the other hand to the aerodynamic air stream around the sensing element which changes the electrical current value.

More recently, apparatus of the alternating current type, usually called "field mills" have been proposed, wherein the electrical current circulating in the sensing element between a measuring or detection electrode and the earth is measured through a periodical modulation of the electrical field applied to the measuring electrode, obtained by means of a rotating mask called a modulation electrode. The measured electrical field is proportional to the difference of the signals picked up by the detection electrode, on the one hand when said electrode is not masked and on the other hand when it is masked. In some of such apparatus, the measurement consists of reading on a previously calibrated oscilloscope the value of the electrical current flowing through a resistor which is part of a circuit connecting the measuring electrode to the mass. The measurement of the field is dependent upon the rotation speed of the modulation electrode. Other apparatus of such type, more sophisticated, comprise an integrating amplifier, the input of which is connected to the detection electrode. In that case, the amplitude of the output voltage does not depend any more on the rotation speed of the modulation electrode. However, all of these apparatus, although they measure the value of the atmospheric field and its slow variations, are not adapted for providing measurement of rapid variations, such as those appearing after atmospheric discharges during storms.

OBJECTS AND SUMMARY OF THE INVENTION

The object of the invention is to provide an apparatus for knowing at any moment the static value of an electrical field, determining its slow variations and simultaneously measuring its rapid variations.

The apparatus according to the invention also operates satisfactorily in stringent environment conditions (rain, hail, wind, etc.) for monitoring the atmospheric electrical field.

The starting point of the invention is the known fact that the useful portion of the electrical signals provided by a sensing element placed in a uniform electrical field and comprising a detection electrode and a modulation electrode of similar dimensions is not the truthful rendering of the field. This is due to the fact that, even if the geometrical mask of the detection electrode is well made, some field lines can still reach it. On the one hand, the detection electrode delivers, when completely masked by the modulation electrode, a stray signal putting a limit to the useful signal amplitude. Yet, the sensing element gain depends on the amplitude of the electrical field variations.

For improving the signal/noise ratio, the invention provides means for reducing notably the value of the stray signal when the detection electrode, in masked. Thus is the processing of the useful signal, the periodical portion of which has a zero average is not only optimizable by means of an electronic device, but rapid field variations consecutive to atmospheric discharges can be measured while preserving a constant measuring gain.

The object of the invention is to provide an electrical field modulation sensing element, characterized in that it comprises, interposed between the detection electrode and the modulator, a fixed conductive screen connected to the electrical mass of the sensing element for preventing the detection electrode from being subjected to the influence of the field when being masked by the modulator.

According to an embodiment in which a detection electrode disc is associated with a rotating metallic modulating disc comprising apertured sectors, the screen is made of a fixed disc formed with the same cut-out as the modulating disc, but projecting outwardly with its non-perforated peripheral portion from the modulating disc and the detection disc.

An object of the invention is also to provide an apparatus having a measuring line for the processing of the signal delivered by the detection electrode, comprising means for supplying a demodulated signal, wherein the demodulation is carried out along two parallel paths, the outputs of which are applied to a differential amplifier, each of said paths comprising a sample and hold device controlled by synchronizing signals off-set from each other in time by a half period of the sampling frequency.

Such an apparatus is particularly advantageous for measuring the abrupt variations of an electrical field, particularly the atmospheric electrical field resulting from electrical discharges in stormy weather.

BRIEF DESCRIPTION OF THE DRAWINGS

In the following description which is given by way of example, reference is made to the accompanying drawings wherein:

FIGS. 5a–s are signal diagrams, FIG. 6 is a block-diagram of an apparatus comprising a measuring line for processing the signals.

DETAILED DESCRIPTION OF THE PREFERRED EMBODIMENTS

Figure 1:
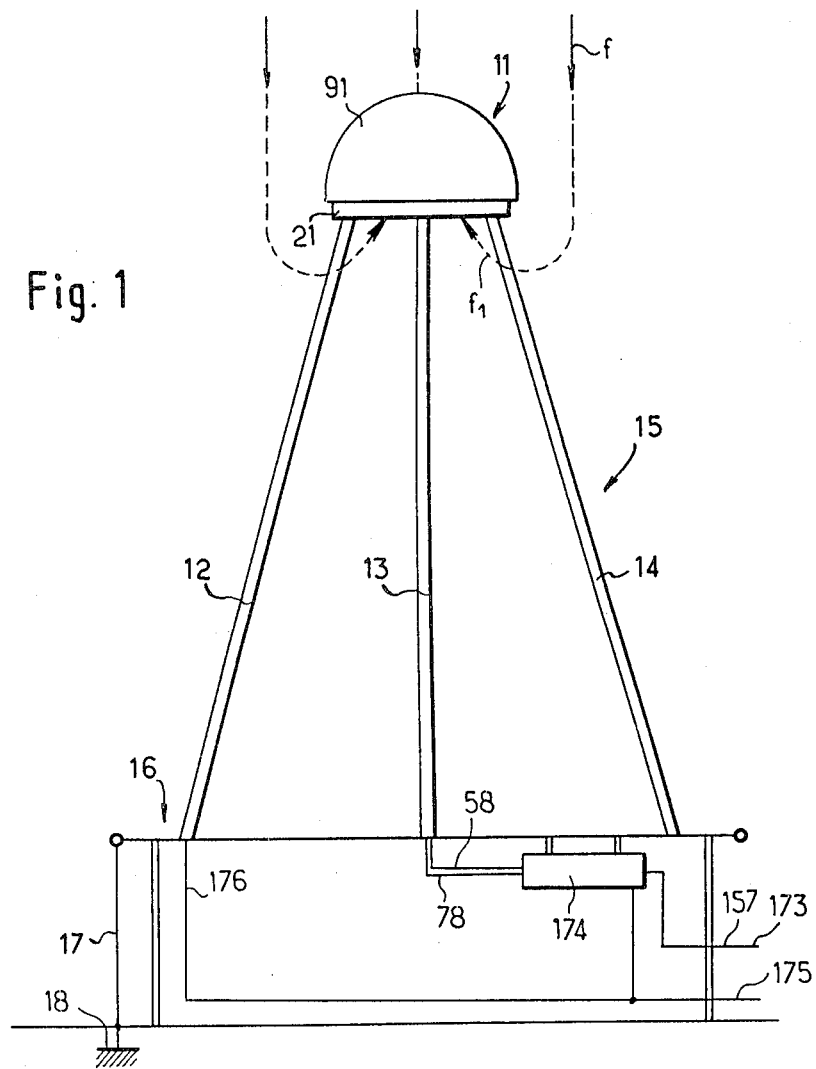
FIG. 1 is a general view of a sensing apparatus.

Reference is first made to FIGS. 1 to 4.

The sensing element 11 (FIG. 1) is carried by three legs 12, 13, 14, which are made of an electrically conductive material, form a tripod 15, and are placed on a metallic base 16 connected to earth by a conductor 17 buried in the ground 18.

The sensing element 11 comprises a sensing element body 21 (FIG. 2) carried on the tripod 15. The body 21 has the shape of a reversed cup with an upper bottom 22 and an edge 23, the opening 24 of the cup being turned downwardly.

The cup houses a first disc 25, fixed at the bulging end 26 of a conductive sleeve 27 forming the prolongation of an output shaft 28 of an electric motor 29. The motor is housed inside a cylindrical casing 31 forming the prolongation of the cup 21 and the axis 32 of which, in alignment with that of motor 29, is normal to the cup bottom 22. The motor 29 is carried by the bottom 33 of casing 31 and supplied by two conductors 34 and 35 from a supply unit 30.

The disc 25 is formed with a succession of cut-outs 36 (FIG. 3) defining sectors 37 having a periphery 38 and radial edges 39 and 41.

Figure 2:
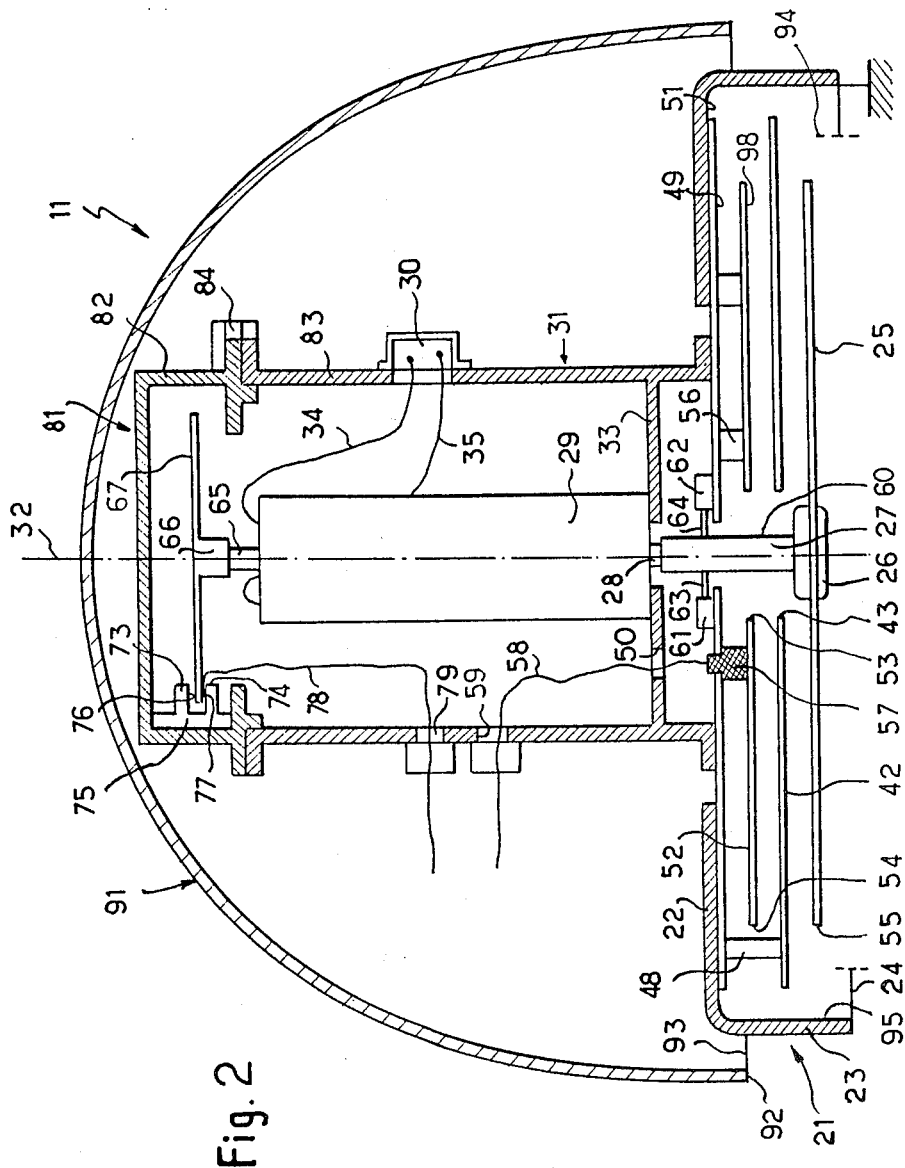
FIG. 2 is cross-sectional schematic view of a sensing element which is part of said apparatus, FIG. 3 are perspective schematic views of discs which are part of the sensing element, FIG. 4 are side schematic views of such discs.

Above disc 25 is a second disc 42, coaxial to disc 25 and the central opening 43 of which allows fitting in sleeve 27. The disc 42 is formed with cut-outs 44 regularly distributed angularly about axis 32 and in the shape of sectors, each sector being bounded by a peripheral edge 45 and radial edges 46 and 47. The angular span of the cut-outs 44 is equal to the angular span of sectors 37, i.e., the angle between the edges 39 and 41 of a sector 37 is equal to the angle between the edges 46 and 47 of a cut-out 44. The radial distance from a peripheral edge 45 of a cut-out 44 is smaller than the radial distance from the peripheral edge 38 of a sector 37, as shown in phantom by line 38′ (FIG. 3) as a projection of edge 38 on the plane of disc 42. The disc 42, which can thus play the role of a screen, is carried by metallic braces 48, as best seen in FIG. 2, depending from a covering plate 49 applied on the inner surface 51 of the cup bottom 22. The disc 42 is thus a fixed disc.

A third disc 52, or detection electrode, is fixed on top of disc 42 and formed with a central opening 53 for the passage of sleeve 27. Disc 52 has a circular edge 54 of the same diameter as the circular edge 55 of disc 25. It is fixed to insulating studs 56 fixed in turn onto the covering plate 49. On disc 52, which is metallic and opens downwardly, is erected an insulating stud 57 through which passes a conductor 58, engaging disc 52 and extending into casing 31 via a hole 50 of bottom 33 and out of casing 31 via a hole 59 formed in the latter, the conductor 58 being connected at its other end to measuring equipment.

From the covering plate 49 depend two conductive studs 61, 62 carrying brushes, respectively 63 and 64, rubbing against the periphery 60 of sleeve 27.

On a second shaft 65 of motor 29, opposite shaft 28, is mounted via its hub 66 a fourth disc 67. As seen in FIG. 3, the periphery of disc 67 is cut out so as to form teeth 68, the edges 69 and 71 of which define, with adjacent teeth, inter-teeth gaps 72, the toothing of disc 67 having the same angular disposition as the sectors and cut-outs of discs 25 and 42. The disc 67 extends between the two bars 73 and 74 of an opto-electronic device 75, one of the bars 73 comprising a light source 76 and the other bar 74 a photo-sensitive cell 77. As seen in FIG. 2, the output circuit 78 of device 75 passes through casing 31 via a hole 79.

The opto-electronic device 75 depends from a cover 81, the side wall 82 of which is the prolongation of the side wall 83 of casing 31. Means, shown schematically at 84, is provided for adjusting the angular position of cover 81 relative to casing 31.

The assembled sensing element 11 is covered by a hemispherical metallic cap 91 which is connected to the sensing element mass and opened downwardly. The lower edge 92 of cap 91 is located slightly below the upper bottom 82 of cup 21, defining with the latter a small gap 93.

The operation of the sensing element 11 is the following:

The lines of force f (FIG. 1) of the inductive electrical field, which are vertical lines in the downward direction in the case of the atmospheric electrical field, are deflected upwardly as shown by arrows $f_1$, due to the metallic masses formed by the tripod 15 and the cup 21.

The lines of force enter the cup 21 through opening 24 of the latter (FIG. 2) then fall upon either the lower face of the first disc 25 or in the gap 94 provided between edge 55 of the first disc, or modulating disc, and the inner surface 95 of the cup edge 23. Amongst the lines of force which strike disc 25, only those directed to the sectorial gaps 36 formed between the sectors 37 of the disc pass through disc 25. The field lines meet in succession, on peripheral edge 45, openings or cut-outs 44 and solid portions 97 of disc 42. They pass through disc 42 only via the openings 44. The result is that disc 52 is struck on its lower face 98 only by the lines of force having passed through the openings 44, therefore those having passed through the openings 36 of the modulating disc 25.

A line of force, such as the line of force $f_2$ (FIG. 4) penetrating cup 21 within gap 94 between the circular edge 55 of disc 25 and the cup edge 23 is either stopped by the peripheral portion 99 of disc 42, which is without cut-outs and protrudes radially relative to edge 55, or, such as the line of force $f_3$, cannot reach disc 52 due to the protrusion of disc 42 relative to disc 52.

The evolution in time of the electrical field sensed by disc 52 is therefore represented by a diagram of substantially triangular shape, as shown at $q_1$ in FIG. 5b. At the moment corresponding to the amplitude minimum, the disc 52 is not met by any line of force of the electrical field. At the moments corresponding to the maximums, disc 52 receives the maximum of the electrical field.

The signal provided by circuit 58 is applied to input 111 (FIG. 6) of an operational amplifier 112 with feedback circuit 113 comprising a capacitor 114, and at the output 115 of which appears a modulated signal v(t) applied to the input 116 of a synchronous demodulator 117 comprising two analogue gates 118 and 119. The control of the gates is effected by applying to another input 121 of the demodulator a signal provided, through an appropriate electronic device, by the opto-electronical device 75. The gates 118 and 119 are therefore controlled in synchronism with the modulation.

The output 122 of gate 118 is applied to a first input 123 of a differential amplifier 124 and the output 125 of gate 119 is applied to the second input 126 of amplifier 124. The output 127 of the differential amplifier is applied to the input 128 of a low-pass filter 129 and to the output 131 of the latter is obtained a voltage value representative of the electrical field influencing the sensing element 11.

Figure 7:
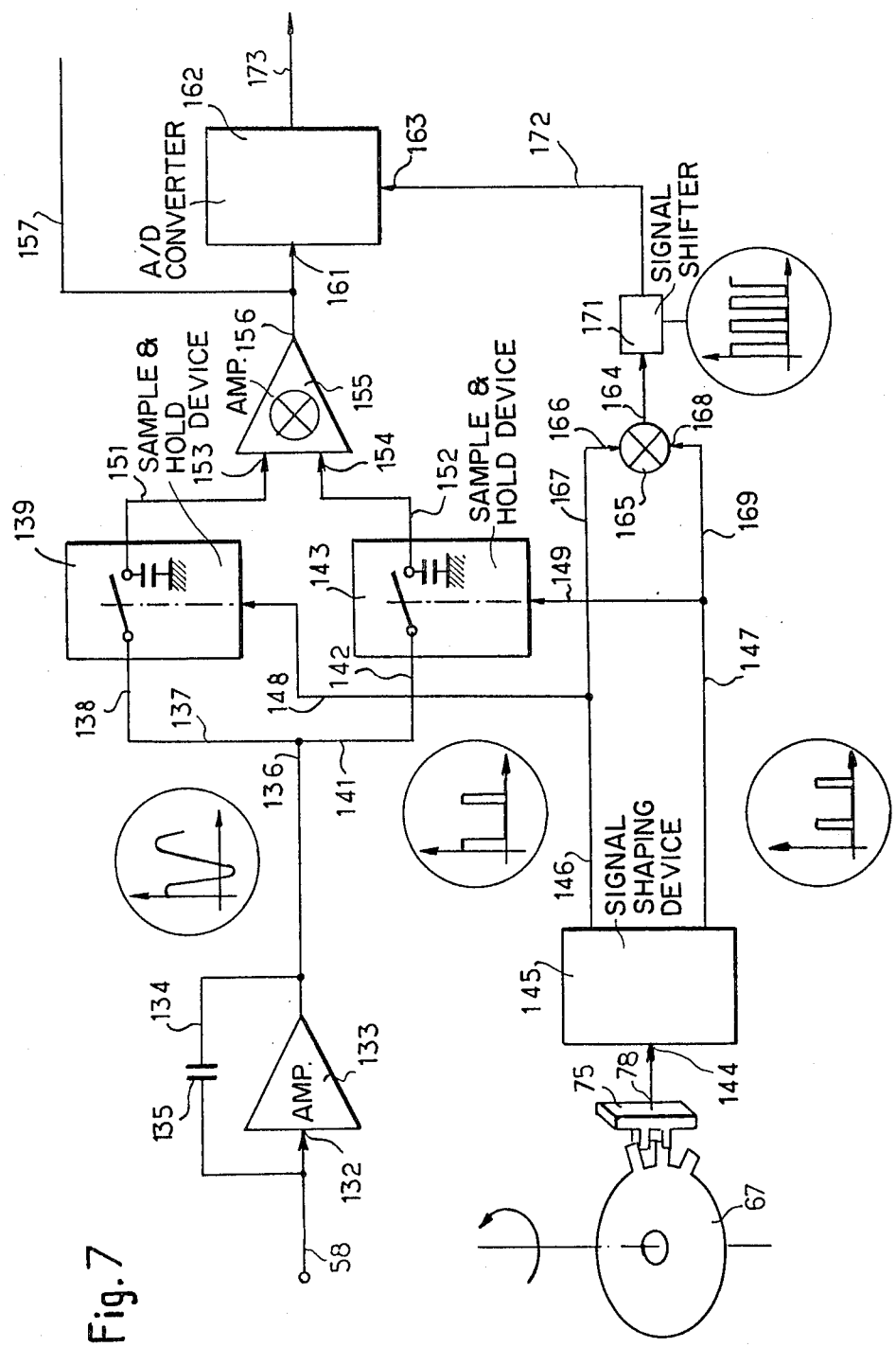
FIG. 7 is a view similar to FIG. 6, but for another embodiment.

Reference is now made to FIG. 7 which illustrates to another embodiment of the electronic processing device. The connection 58 from the sensing element 11 is applied to the input 132 of an operational amplifier 133 having a feedback circuit 134 comprising a capacitor 135. The output 136 of the amplifier 133 is divided into a first line 137 applied to input 138 of a first sample and hold device 139 and a second line 141 is applied to input 142 of a second sample and hold device 143.

The output connection 78 of the opto-electronic device is applied to the input 144 of a signal shaping device 145, supplying at its first output 146 a control signal formed by a succession of signals, the frequency of which depends on the modulation period, and at its second output 147 a succession of signals of the same period, but off-set by a half period relative to those supplied by output 146.

The output 146 is connected by a line 148 to the first sample and hold device 139 for controlling it. The second output 147 is connected via a line 149 to the sample and hold device 143 for controlling the latter. At the output 151 of the sample and hold device 139 there is a continuous voltage of one sign and at the output 152 of the other sample and hold device there is a continuous voltage of a sign opposite to the first. These two voltages are applied to the respective inputs 153 and 154 of a differential amplifier 155. At the output 156 of amplifier 155, there is a voltage representative of the electrical field influencing the sensing element 11. This voltage can be used directly on an analogue output 157 of the electronic processing device.

In the embodiment of FIG. 6 as well as in that of FIG. 7, the signal which is present at outputs 131 and 157, respectively, is independent of the rotation speed of motor 29.

Reference is now made more thoroughly to FIGS. 5.

The physical value to measure, viz. the field E(t) is shown in FIG. 5a. In the example chosen, the field increases first slowly, as is shown by the rectilinear portion $p_1$, slightly ascending, then very quickly when there is lightning, as is shown at $p_2$, and then the slow variation goes on, as is shown by the portion $p_3$, but at a higher level.

The curve Q(t) of FIG. 5b represents, as already noted, the corresponding evolution in time with the charge induced on the detection electrode disc 52. With the sensing device, the output signal of the detection electrode is a substantially triangular signal the period of which is that of the modulation. The signal varies between a zero value and a maximum value, and it is the amplitude of the signal which is representative of the field.

In correspondence with the slowly increasing portion $p_1$ of FIG. 5a, the amplitude varies first progressively, as is shown by portion $q_1$. Then, when lightning occurs, there is an abrupt variation of the signal following the practically vertical line $q_2$. Then the signal goes on with its almost triangular variation on portion $q_3$, but with amplitudes corresponding to the slowly ascending portion $p_3$ of the field value.

At the output of amplifier 133, a signal v(t) is obtained as is shown in FIG. 5c, which is directly proportional to the charge Q(t).

After a first portion $v_1$, corresponding to the slow growth of the field value, the curve v(t) comprises a substantially vertical portion $v_2$, to which are connected, on portion $v_3$, periodical portions having a larger amplitude than on portion $v_1$, but returning in a progressive way so as to be symmetrical relative to the X-axis. This is due to the response time of amplifier 133.

The signal of FIG. 5d, Op(t), is supplied by the opto-electronic device and appears at that output 78 of the device. The signals $H_1$, $H_2$ of FIG. 5e, 5f are respectively the signals provided by the electronic processing device of signal Op(t) foreseen for the control of the sample and hold devices, respectively 139 and 143.

The diagram of FIG. 5g is representative of signal $B_1$ present at output 151 of the sample and hold device 139 and that shown in FIG. 5h represents the signal $B_2$ appearing at output 152 of the sample and hold device 143.

During a period of the opto-electronic signal which is equal to the modulation period, the signals $B_1$ and $B_2$ shown in the diagrams of FIGS. 5g and 5h have a constant value and one distinguishes between two successive values the existence of a usual transition. Portion $b_{11}$ and portion $b_{21}$ correspond to the slow increase of field $p_1$. The lightning breaks out and it is the sampling carried out by the sample and hold device 139 which, in this example, is the first which is operative after the lightning: to it corresponds the abrupt vertical increase shown at $b_{12}$; at the following sampling operation, by the sample and hold device 143, the portion $b_{22}$ is weaker.

If, due to the time constant of amplifier 133, the values of signal $B_1$ shown at $b_{13}$ are then weaker than those which would correspond to the values of the field shown by line $p_3$, the absolute values of portion $b_{23}$ are on the other hand greater, so that after their passage through the differential amplifier, the output U(t) of which is shown on the diagram of FIG. 5i, one obtains a portion $u_3$ of the curve which is the truthfull rendering of field $p_3$.

A measuring apparatus operating with a modulation period of 0.5 ms and a time constant of amplifier 133 equal to 50 ms allows measuring, when there is lightning lasting 50 microseconds, viz. ten times shorter than the modulation period, the atmospheric electrical field with an error smaller than 1% and which is then cancelled within 50 milliseconds.

In the embodiment shown in FIG. 7, the signal U(t) is also applied to the input 161 of an analog-to-digital converter 162. The numeration control input 163 of converter 162 is connected to the output 164 of an adder 165. The input 166 of adder 165 is connected by a line 167 to circuit 146 and the other input 168 of which is connected by a line 169 to circuit 147. A device 171 interposed on line 172 connecting the output 164 of adder 165 to input 163 of the analog-to-digital converting device 162, introduces a shift of a few millionths of a second on the signal in order that the numeration be carried out at the appropriate times. The numeration control signal has been shown at $H_3$ on FIG. 5j. The numerated output present in line 173 can be applied to the input of a recording device, as also the output present in line 157.

The electrical device unit 174 (FIG. 1) for processing the signals is supplied by a line 175 from a power unit supplying the sensing element 11 via line 176.

We claim:

1. An electrical field sensing apparatus, particularly for measuring the atmospheric electrical field, comprising: a housing; a fixed detection electrode; a rotating modulator; a fixed screen having apertures formed therein and made out of an electrically conductive material connected to the housing, said fixed screen being interposed between said detection electrode and said rotating modulator, and said fixed screen being wider than said detection electrode for protecting said detection electrode against the influence of the measured electrical field when the apertures in said fixed screen are covered by the rotating modulator; a driving motor for the modulator; a metallic cup for housing the electrode modulator and screen, the metallic cup having an opening turned downwardly, with the modulator being positioned closest to the opening of the cup; metallic legs for positioning the metallic cup above a surface on which the legs rest; a cylindrical casing fixedly connected at one end to the cup for containing the driving motor of the modulator; a cover connected to the end of the cylindrical casing opposite the cup and angularly adjustable in position relative to the casing; and an opto-electrical device including a light source, a photo-electrical receiver, and a toothed disc rigidly connected to the driving motor, interposed between the light source and the photo-electrical receiver and carried by the cover.

2. A sensing apparatus according to claim 1, wherein the detection electrode, the screen, and the modulator are discs, wherein the modulator disc has a succession of solid sectors separated by sector gaps, and wherein the screen disc has a succession of solid sectors and sector apertures of the same configuration respectively as the solid sectors and the sector gaps of the modulator disc, has a larger diameter than the modulator disc, and has a solid outer peripheral portion extending beyond the outer peripheral edge of the modulator disc.

3. A sensing apparatus according to claim 2, wherein the modulator disc and the detection electrode have the same diameter.

4. An apparatus according to claim 1 further comprising a conductive hemispherical cap for encapsulating the cup and the casing, the hemispherical cap having an edge surrounding the edge of the cup and connected to the housing.

5. The sensing apparatus of claim 1, 2 or 3 further comprising an electrically conductive surface connected to a portion of the housing of the sensing apparatus located on said fixed screen opposite to said rotating modulator, said detection electrode being mounted between said screen and said conductive surface.

6. An apparatus according to claim 1 further comprising a conductive hemispherical cap for encapsulating the cup and the casing, the hemispherical cap having an edge surrounding the edge of the cup and connected to the housing.

7. An electrical field sensing and measuring apparatus comprising:
(a) a sensing device having (i) a housing, (ii) a fixed detection electrode, (iii) a rotating modulator, and (iv) a fixed screen having apertures formed therein and made of an electrically conductive material connected to the housing, the fixed screen being interposed between the detection electrode and the rotating modulator;
(b) an opto-electronic device having a rotatable toothed disc, light source, and photo-electrical receiver, for providing an opto-electronic signal; and
(c) circuit means having (i) an amplifier having an input connected to the output of said sensing device; (ii) a pair of parallel analog gates having inputs connected to the output of said amplifier, the closing of said gates being controlled by the opto-electronic signal from said opto-electronic device; (iii) a differential amplifier having inputs connected respectively to the outputs of said analog gates; and (iv) a low-pass filter connected to the output of said differential amplifier.

8. A sensing apparatus according to claim 7, wherein the detection electrode, the screen, and the modulator are discs, wherein the modulator disc has a succession of solid sectors separated by sector gaps, and wherein the screen disc has a succession of solid sectors and sector apertures of the same configuration respectively as the solid sectors and the sector gaps of the modulator disc, has a larger diameter than the modulator disc, and has a solid outer peripheral portion extending beyond the outer peripheral edge of the modulator disc.

9. A sensing apparatus according to claim 7, wherein the modulator disc and the detection electrode have the same diameter.

10. An electrical field sensing and measuring apparatus comprising:
(a) a sensing device having (i) a housing, (ii) a fixed detection electrode, (iii) a rotating modulator, and (iv) a fixed screen having apertures formed therein and made of an electrically conductive material connected to the housing, the fixed screen being interposed between the detection electrode and the rotating modulator;
(b) an opto-electronic device for providing a periodic signal synchronized with the rotation of said rotating modulator; and
(c) circuit means having
(i) an amplifier having an input connected to the output of said sensing device;
(ii) a signal shaping device having an input connected to said opto-electronic device and two control signal outputs off-set in time relative to each other by a modulation half period;
(iii) a pair of parallel sample and hold devices having inputs connected to the output of said amplifier, the sample and hold devices being controlled respectively by the control signal outputs from said signal shaping device; and
(iv) a differential amplifier having inputs connected respectively to the outputs of said sample and hold devices.

11. A sensing apparatus according to claim 10, wherein the detection electrode, the screen, and the modulator are discs, wherein the modulator disc has a succession of solid sectors separated by sector gaps, and wherein the screen disc has a succession of solid sectors and sector apertures of the same configuration respectively as the solid sectors and the sector gaps of the modulator disc, has a larger diameter than the modulator disc, and has a solid outer peripheral portion extending beyond the outer peripheral edge of the modulator disc.

12. A sensing apparatus according to claim 10, wherein the modulator disc and the detection electrode have the same diameter.

* * * * *